United States Patent [19]
Nickel et al.

[11] Patent Number: 5,295,178
[45] Date of Patent: Mar. 15, 1994

[54] DIGITAL SIGNAL PROCESSOR FOR RADIO BASE STATION

[75] Inventors: Rodney L. Nickel; Daniel I. Schwed, both of Lynchburg; Claude L. Vignali, Forest, all of Va.

[73] Assignee: Ericsson GE Mobile Communications Inc., Lynchburg, Va.

[21] Appl. No.: 620,421

[22] Filed: Dec. 3, 1990

[51] Int. Cl.$^5$ .................... H04M 11/06; H04J 3/12
[52] U.S. Cl. ................................ 379/58; 379/63; 370/110.2; 370/110.3; 370/110.4; 455/9; 455/35.1
[58] Field of Search .............. 379/58, 59, 63, 102, 379/250, 402-404, 406, 60; 370/110.2, 110.3, 110.4, 95.1; 455/9, 10, 35.1, 38.5, 56.1

[56] References Cited

U.S. PATENT DOCUMENTS

| | | |
|---|---|---|
| 4,047,009 | 9/1977 | Challen . |
| 4,087,638 | 5/1978 | Hayes et al. . |
| 4,231,018 | 10/1980 | Imigawa et al. . |
| 4,317,218 | 2/1982 | Perry ..................... 455/10 |
| 4,528,696 | 7/1985 | Martin, III . |
| 4,561,115 | 12/1985 | Pfeifer . |
| 4,598,172 | 7/1986 | Eriksson ............... 379/250 |
| 4,627,098 | 12/1986 | Dolikian et al. . |
| 4,654,881 | 3/1987 | Dolikian et al. ..... 379/102 |
| 4,658,435 | 4/1987 | Childress et al. . |
| 4,837,800 | 6/1989 | Freeburg et al. ..... 379/59 |
| 4,870,699 | 9/1989 | Garner et al. . |
| 4,887,311 | 12/1989 | Garner et al. . |
| 4,947,454 | 8/1990 | Garner . |
| 5,001,742 | 3/1991 | Wang ................... 379/60 |
| 5,023,902 | 6/1991 | Anderson et al. ..... 379/59 |

FOREIGN PATENT DOCUMENTS 0302246  2/1989  European Pat. Off. ............ 379/250

OTHER PUBLICATIONS

Magazine advertisement for "Kenwood TS-950SD Transceiver" published in Dec., 1990.
Chrysafis, "Digital Sine-Wave Synthesis Using The DSP56001," Motorola brochure (1988).
Garcia, "Precision Digital Sine-Wave Generation With The TMS32010," and Mock, Add DTMF Generation and Decoding to DSP-μP Designs, *Digital Signal Processing Applications With The TMS320 Family*, Texas Instruments (1986).
Marven, "General-Purpose Tone Decoding and DTMF Detection," *Digital Signal Processing Applications With The TMS320 Family: Theory, Algorithms, And Implementations*, vol. 2, Texas Instruments (1990).
"Hypersignal Users Manual," Hyperception (Mar. 1989).
Burrus and Parks, "DFT/FFT And Convolution Algorithms," pp. 32 to 36, 104 to 106.
Smith, "Dual-Tone Multifrequency Receiver Using The WE® DSP16 Digital Signal Processor," Application Note, AT&T 1989.
Booklet, "Dual-Tone Multi-Frequency Coding," Chap. 6, pp. 6-1 to 6-59.
GE Mobile Communications, "Tone Remote And Tone Remote/Repeater Control Panel," LBI-31853E (1988).
GE Mobile Radio, "Description And Maintenance: MASTR®II Base Station Combinations," LBI-30775H.

Primary Examiner—Jin F. Ng
Assistant Examiner—Dwayne D. Bost
Attorney, Agent, or Firm—Nixon & Vanderhye

[57] ABSTRACT

A digital FM base station radio having a dedicated digital signal processing (DSP) board operates on audio signals from RF links and land lines. The DSP board detects, filters and generates tones and communicates information regarding these tones to a controller microprocessor on the central control board for the radio.

6 Claims, 6 Drawing Sheets

DIGITAL SIGNAL PROCESSOR FOR RADIO BASE STATION

FIELD OF THE INVENTION

The invention generally relates to a digitally-controlled radio. A digital FM base station radio is disclosed having a dedicated digital signal processing (DSP) board that operates on audio signals from RF links and land lines. The DSP board detects, filters and generates tones and communicates information regarding these tones to a controller microprocessor on the central control board for the radio.

RELATED APPLICATIONS

The following commonly assigned patent applications are incorporated by reference:

Ser. No. 07/596,357 filed Oct. 12, 1990, entitled "A Full Duplex RF Repeater/Base Station Providing Microprocessor-Controlled Simultaneous CTCSS Tone Encode/Decode."

Ser. No. 07/620,422, filed Dec. 3, 1990, entitled "Remote Control of RF Base Station Via Digital Communications."

Ser. No. 07/620,423, filed Dec. 3, 1990, entitled "Local Area Network for Flexible Digital Communications Within and Between RF Base Stations."

BACKGROUND AND SUMMARY OF THE INVENTION

In public service radio, it is common to superimpose control tones on audio signals. These control tones generally have sub-audible frequencies below 300 Hz, but may also be in the audible frequency range. These tones convey control commands and other information signals. The tones may be, for example, sent from one radio to another over an RF link or from a dispatcher console to a remote base station over land lines.

Tones are no longer used merely to remotely turn transmitters on and off and other basic control functions. Tones are performing an ever increasing variety of functions. Tones can be used to remotely control a base station or mobile transceiver receiver, monitor the operation and/or internal settings of a receiver, and send voting control information to central site controllers. It is impossible to predict how tones will be used in upcoming years, other than to say that tones will be used even more extensively than they are now used. For example, tones may be used to allow a mobile radio to link with a telephone connection at the base station and for many other radio operations.

Base stations, in particular, need to be able to encode and decode tones. It is often preferable to locate a base station near the antennas located on top of high buildings or on top of mountains. These inaccessible base stations are remotely controlled over land lines by one or more dispatcher consoles.

Tones are used to remotely control the base station. Furthermore, much of public service radio communications is between repeating base stations and remote mobile units and, thus, the base stations handle a large volume of the tone traffic in the system. Tone remote detection is typically used to remotely control base station systems. This coding allows a wide range of control functions to be implemented by remote tones. Tone remote detection is governed by industry standards that establish the format of tones and a library of their functions. The format for tone remote detection is a high volume secur-it tone (100 ms), a function tone (40 ms) and a hold tone if the function tone is a transmit function. The hold tone continues as long as a voice audio signal remains.

There are other kinds of tone codes used in public service radio. A common code is dual-tone multi-frequency (DTMF) coding for sending alphanumeric signals entered by a 12 or 16 pad keyboard. DTMF is generally referred to as "Touch Tone." DTMF coding is generally used to remotely turn on and off repeaters, especially the transmitter of the repeater. Type 90 tone is an older but still used tone code principally used to turn remote repeaters on and off. Type 90 coding uses single signals instead of the dual-frequency tones of DTMF.

Previously, base stations could not be easily adapted to accept new tones or handle an increasing volume of tone traffic. Prior base stations had separate hardware modules for each of the specific functions that were tone controlled. For example, a DTMF decoder module decoded the dual frequency alphanumeric tones of DTMF. Another module encoded DTMF signals. Similarly, tone remote control, voting tone generation, hold tone notching and Type 90 tone detection were each generated in separate modules. For example, the Ericsson-General Electric MASTR II Base Station Controller had separate plug in modules for tone remote control, tone generation and DTMF decoding.

Existing hardwired modules could not accept new tones without modification. Generally, another module was added to accommodate new tone types, assuming that the base station could be modified to accept new modules. Similarly, each module could only process a certain maximum amount of tone traffic. When the traffic exceeded the capacity of any one module, the base station had no ability to shift unused capacity in another module to the overloaded module. Accordingly, existing base stations do not have the capacity to handle new tones or large increases in the volume of any particular type of tone. Given the increasing use of tones, this inflexibility severely hampers the usefulness of existing base stations and the ease with which new tones can be added to the radio system.

The compartmentalized modules in prior base stations are bulky and complex. The numerous hardware modules increases the size and cost of the radio. Since each module has its own circuitry and logic units, and the modules interface with one another, the modules are complex and may be prone to failure.

Maintenance of modularized base station radios is time consuming and expensive. Modules are generally replaced when broken. The modules are not interchangeable with other modules in the base stations. Accordingly, a repair technician, who cannot generally predict which module is to be replaced before inspecting the radio, is required to carry a spare of every module in the radio or order a replacement for the broken module from the radio manufacture. It is impractical and prohibitively expensive to stock spare radio modules in every van of each repair technician. Thus, replacement modules are ordered from the manufacturer and the radio remains down (unusable) until the replacement module is received. Long down times for radios are abhorred, especially in public service radio systems which service police, fire squads, paramedics and other emergency units.

Maintaining and upgrading the performance of existing base stations generally requires the repair technician to visit the base station to make adjustments or add new components. Most prior base stations have adjustable potentiometers that are manually adjusted for each radio customer. Heat and other environmental factors affect the operation of these potentiometers. Accordingly, these potentiometers may need to be reset from time to time. The need for manual adjustments increases the need for and expense of maintenance of base station radios. Similarly, to upgrade a base station radio, such as to handle new tones, requires that a technician physically install new components into the radio and, possibly, manually adjust these new components. In short, prior base station radios lack flexibility and are expensive to maintain.

It has recently become known to provide remote mobile radio units with a digital signal processing board that plugs into the central controller board of the radio. U.S. Pat. No. 4,887,311, entitled "Radio With Options Board" issued on Dec. 12, 1989, to Terry Garner and Robert Dixon (the Garner Patent). The Garner Patent discloses an optional digital processor that interfaces with the control microprocessor for the radio. This digital processor allows the radio to handle several additional tone controlled functions. The digital processor receives processed RF audio from the radio's audio processor. The digital processor issues commands to the control microprocessor to implement these new tone controlled functions.

The digital processor disclosed in the Garner Patent works well with mobile radio units that communicate solely over an RF link but not over land or telephone lines. Moreover, the relatively low volume of traffic flowing through a mobile radio unit allows the existing audio processor to handle an add on digital signal processor. Finally, the radio control architecture disclosed in the Garner Patent is well suited to a mobile radio unit, but not to a base station. While the Garner Patent discloses a digital processor for mobile units, there remained a need for a flexible tone detection, filtering and encoding device for base stations having multiple audio inputs and handling a high volume of tone traffic.

This need for digital processing flexibility in a base station is satisfied by the present invention. We have developed a base station having a universal digital signal processing (DSP) module that is fully programmable. In the preferred embodiment, the DSP module is a piggy-back board that attaches to the central controller board (control shelf) of the base station radio. The DSP module preforms the tone decoding, filtering and generation previously performed by separate hardware modules. The DSP module has digital potentiometers that can be remotely programmed. All of the operating parameters of the DSP board can be programmed. Thus, the operating personality (e.g. operating parameters unique to the customer), ability to handle tones and maintenance adjustments can be programmed or reprogrammed into the DSP module without altering the hardware of the base station.

Moreover, the DSP board can be remotely monitored and programmed. For example, a technician can communicate directly with the radio board via a telephone interface, receive information regarding current settings and operation of the DSP board, and reset the DSP board including its potentiometers over the telephone. Accordingly, the technician can remotely diagnose and often remotely repair the base station. If the technician is required to physically visit the radio, he need only bring a single substitute DSP board, instead of the many hardware modules previously required.

A universal DSP board and digital signal processor replaces the various hardware modules previously required for signal processing. The DSP board is compact, inexpensive and flexible compared to the numerous hardwired modules used for tone control in prior base stations.

In the preferred embodiment, the DSP board includes two coder-decoder (codec) processors to handle the conversion of audio between analog and digital signals. Audio signals are received and transmitted over RF links, and over land lines and telephone lines. The DSP processor operates on the digitized audio signals through serial interfaces between each of the codecs.

The DSP board module interfaces with the controller board of the base station. A parallel communication interface including a dual port random access memory (RAM) device allows the controller board to communicate with the DSP microprocessor. The central controller can set the operating parameters of the DSP board, issue commands to the DSP microprocessor such as tone generation, and receive information derived from the audio signals by the DSP microprocessor.

The DSP board fundamentally handles tone detection, tone filtering and tone generation. These functions may be performed simultaneously. Each function may be enabled or disabled. Additionally, functions can be programmed into the DSP processor. Similarly, the controller can alter operating parameters for the DSP board, such as the potentiometer settings and codec channel assignments.

The DSP board of the present invention handles detection and decoding for DTMF, Type 90 single tones, and tone remote. The detection schemes employed by the DSP microprocessor all employ the Goertzel Algorithm to extract tone frequency information from the digitized audio signal. In addition, the DTMF decoding scheme includes several post-tests to prevent false detection of tones. Similarly, the tone remote decoding scheme has an energy-based algorithm that discriminates between tones having the same frequency such as secur-it, function and hold tones. When it recognizes a new valid tone, the DSP microprocessor passes the tone information it decodes to the controller microprocessor.

In the present invention, the DSP board provides tone filtering. It is known to use notch filters to remove a control tone superimposed on a audio signal. This filtering technique is known as "hold-tone filtering." Notch filters have previously been separate hardware modules in the radio. Incorporating the notch filter as a programmed function of the DSP microprocessor reduces the number of modules in the radio controller and allows for remote digital reconfiguration of the filter by reprogramming the microprocessor.

Similarly, in some applications, certain audio bands are notched out of the signal to prevent corruption of the control tone that is to be superimposed on the audio signal. This notching is "anti-false filtering" and is predominately used in conjunction with the 2-wire remote line interface of the base station.

Tone generation enables a base station to send control signals to external devices. The DSP board, in the preferred embodiment, can generate any tone having a frequency up to 3.2 KHz. The DSP processor is programmed with an algorithm used to generate tones.

This algorithm includes sinusoidal look-up techniques to enhance the precision and efficiency of the tone calculations. By using this powerful and flexible tone generation algorithm, a single DSP processor has been substituted for several prior tone generation hardware modules.

The DSP board can function as an all digital, programmable compressor. Line audio inputs from several sources are filtered, converted to digital, and compressed by the DSP processor. The processor executes an audio compression program that selects and applies the appropriate gain to the digital signal. The compressed signal leaves the processor, is converted to analog form, filtered and routed to a variety of outlets such as an RF power transmitter or line links.

As a digital programable compressor, the DSP board eliminates hum and noise on the line input. In the preferred embodiment, the compressor outputs zero (0) voltage if the line input voltage is below a threshold value. Thus, the usual noise and hum from audio lines are eliminated.

The DSP compressor acts as a hard-limiter to prevent the compressor output signal amplitude from exceeding selected values. Moreover, the DSP processor provides digital control of the various threshold levels applied by the compressor. The DSP processor can be used to implement a software potentiometer. Accordingly, the compressor thresholds can be modified by resetting these software potentiometers in the DSP processor.

It is an objective of the present invention to improve the performance and flexibility of base stations by centralizing most of the tone decoding, filtering, compression and tone generation functions of a radio base station in a single DSP board. In addition, it is an object to reduce the size of base station radios, lower their cost, and simplify their maintenance and repair.

Furthermore, it is an object of the present invention to provide a universal digital signal processing board that can be easily reconfigured to meet various base station requirements. This flexibility allows the base station to be (re)configured either on site or remotely to promptly satisfy customer requirements or to handle new applications of control tones.

DETAILED DESCRIPTION OF THE DRAWINGS

Figure 1:
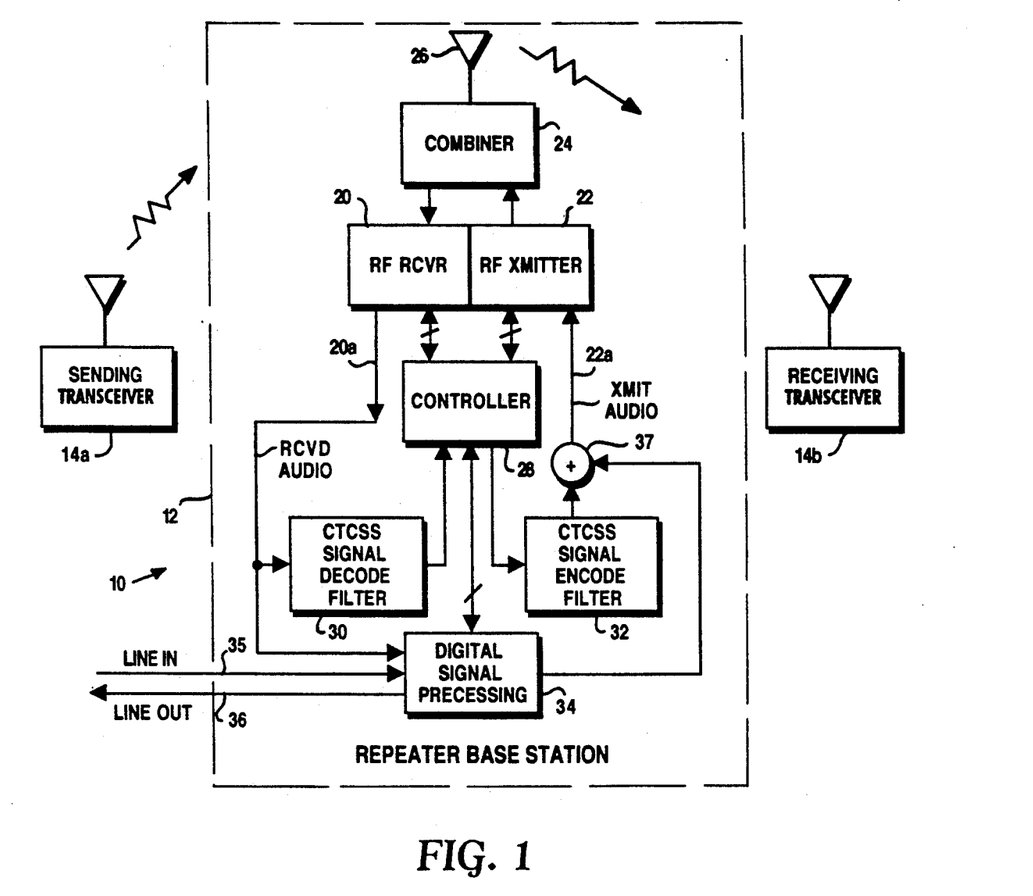
FIG. 1 is a high level block diagram of an exemplary duplex RF communications system in accordance with the present invention.

FIG. 1 is a high level schematic block diagram of the presently preferred exemplary embodiment of a duplex RF communications system 10. System 10, in the preferred embodiment, includes a repeater base station and at least two (and typically hundreds of) user transceivers 14a, 14b. Repeater base station 12 receives an RF transmission from a transceiver 14a and retransmits/regenerates the received RF transmission such that it can be received by other user transceivers 14b. Typically, base station 12 is located on top of a hill or a tall building and is equipped with a relatively high power RF transmitter—whereas user transceivers 14a, 14b may be located anywhere within a particular coverage area (e.g., behind obstructions, in valleys, or in "fringe" portions of the coverage area) and are typically equipped with only relatively low power RF transmitters (e.g., to save vehicle electrical power and to reduce cost). For example, a typical system 10 may include user transceivers providing less than 100 watts of RF output power to inefficient mobile antennas, and a base station 12 providing many hundreds (or even thousands) of watts of effective radiated power (ERP). Thus, while geographical separated exemplary sending and receiving user transceivers 14a, 14b may be incapable of communicating with one another if simplex or other direct communications between them were possible, communications may be reliably established between those two transceivers (and, typically, among a large group of such user transceivers) via repeater base station 12.

In the preferred embodiment, each of user transceivers 14a, 14b transmits on one RF frequency and receives on a different RF frequency. However, in order to reduce costs (and for other reasons as well), the user transceivers 14a, 14b each operate in a "half-duplex" mode—meaning that they cannot transmit and receive simultaneously. Repeater base station 12, on the other hand, is capable in the preferred embodiment of simultaneously receiving RF signals on an input frequency and transmitting RF signals on an output frequency different from the input frequency (as is well understood by those skilled in the art, such "full duplex" mode of operation is the typical and preferred mode of operation for repeater base stations).

Repeater base station 12 in the preferred embodiment includes an RF receiver 20, an RF transmitter 22, a combiner 24 and antenna 26. In addition, repeater base station 12 in the preferred embodiment includes a digital controller 28 performing control operations under software control, a Continuous Tone-Controlled Squelch System (CTCSS) signal decode filter 30, a CTCSS signal encode filter 32, and analog or digital signal processing elements 34. The digital signal processor detects, filters and generates tones directly on audio carried by RF links and land lines 35 and 36.

In the preferred embodiment, RF receiver 20 is a conventional radio frequency receiver operating on a selected RF receive frequency. RF receiver 20 receives RF signals from sending transceiver(s) 14a via RF antenna 26, demodulates those received RF signals, and provides responsive received audio signals on its output 20a. RF transmitter 22 is a conventional high-power RF transmitter having an audio input 22a. RF transmitter 22 produces an RF carrier at a desired frequency (e.g., using a conventional digital frequency synthesizer type local oscillator or crystal oscillator), modulates the RF carrier with audio applied to audio input 22a, and amplifies the modulated signal before transmitting the signal to receiving transceiver(s) 14b via RF antenna 26. In the preferred embodiment, conventional combiner 24 is used to provide isolation between the receive and transmit RF frequencies to permit repeater base station 12 to operate in a full duplex mode (i.e., such that the signal transmitted by repeater base station 12 does not degrade the sensitivity of or otherwise interfere with simultaneous reception of incoming receive channel RF signals by RF receiver 20).

In the preferred embodiment, RF receiver 20 and RF transmitter 22 are digitally controlled by digital controller 28 (this controller in the preferred embodiment provides audio processing and executes prestored software routines controlling various parameters of RF receiver 20 and RF transmitter 22 such as, for example, RF transmit and receive frequencies, RF transmitter key and unkey, RF transmit power level, RF receiver squelched/unsquelch status, etc.).

In the preferred embodiment, the audio output signal provided by RF receiver 20 at output 20a is provided to CTCSS signal decode filter 30 and also to the digital signal processing block 34. The digital signal processing block performs nearly all of the tone detection and generation with the exception of CTCSS tones. In addition the digital signal processor provides some audio filtering functions. The resulting filtered tone signals for the RF link are combined with the signals from the CTCSS encoder at summer 37. The output of summer 37 is applied to the RF transmitter audio input 22a for modulating the transmitter RF output signal.

Figures 2, 3:
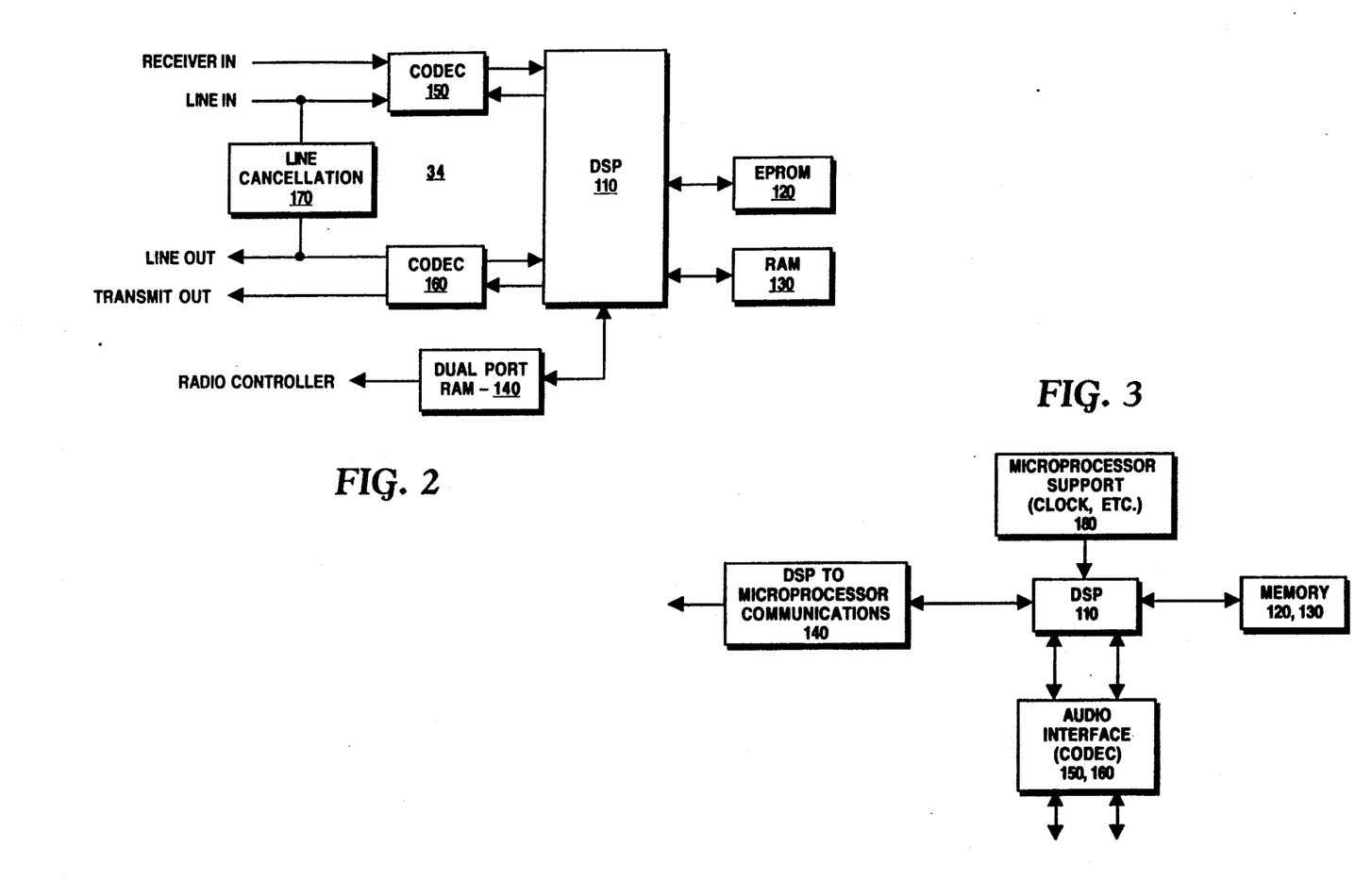
FIG. 2 is a high level block diagram of an exemplary digital signal processing board in accordance with the present invention.
FIG. 3 is a functional block diagram of the DSP board of the preferred embodiment.

FIG. 2 is a high level schematic block diagram of the preferred embodiment of the digital signal processing (DSP) board 34 that plugs into the controller board of a base station that is more fully described in the copending application Ser. No. 07/620,422, entitled "Remote Control of RF Base Station Via Digital Communications."

The DSP board includes a commercially available DSP processor 110 such as the ADSP-2101 Digital Signal Processing Microcomputer. The memory devices necessary to support the DSP processor are provided by an EPROM 120 (erasable programmable memory chip) and a RAM 130 (random access memory). The EPROM is a non-volatile memory that retains programming and initialization parameters that are loaded in to the DSP processor when the DSP board is powered-up or reset. The external RAM 130 is needed to supplement the small amount of internal memory in the DSP processor. When the processor addresses memory in excess of its internal capability, it accesses the external RAM memory.

The DSP processor communicates with the radio's central controller (not shown) for the base station radio through a dual-port RAM 140. The DSP processor places messages for the central controller in the dual-port RAM. Similarly, the DSP processor reads messages from the dual-port RAM from the central controller. Flags on the dual-port RAM are used to signal the DSP when it has a message in the dual-port RAM from the controller. Similarly, the DSP sets a flag in the dual-port RAM after placing in it a message for the central controller.

Audio is received by the DSP from two codecs 150, 160. The codecs are standard digital components generally used in telephone circuits. Codecs convert analog audio signal into digital signals that are sent to the DSP processor and convert digital tone signals from the DSP processor into analog signals sent either to a RF link or over audio lines. Each codec receives and sends RF audio signals from a transceiver or a series of repeaters. The codecs also send and receive audio signals over lines for other base stations, dispatch consoles and telephones. These audio lines have 2-wire and 4-wire inputs into the DSP board. When receiving 2-wire audio, a line cancellation circuit 170 separates transmit audio from receive audio.

FIG. 3 shows functionally the operation of the DSP processor 110. The DSP processor is supported by conventional clocks, power interfaces and other devices 180 necessary to the operation of the DSP processor. These devices are generally coupled to the DSP processor through serial lines. The external memory accessible to the DSP processor is the EPROM 120 and RAM 130, already described. Audio signals are directly accessed by the DSP processor through an audio interface, e.g. codecs 150, 160. This interface provides the DSP with direct access to all audio signals regardless of whether the signals are RF audio or line audio. Moreover, the DSP processor does not require access to separate audio processor such as is on the controller board of the radio. The DSP processor board is fully capable of handling the audio processing necessary for tones.

Commands are sent between the DSP processor and the microprocessor for the radio central controller 28. A dual port RAM 140 is the link between the DSP processor and the controller. The operation and controller are fully described in U.S. Ser. No. 07/620,422, entitled "Remote Control of RF Base Station Via Digital Communications," identified above and incorporated by reference. When the DSP processor detects a tone, it sends an appropriate command to the controller microprocessor through the dual-port RAM. Similarly, the controller microprocessor sends commands, e.g. requested in the generation of a certain tone, to the DSP processor through the dual-port RAM. In addition, the controller microprocessor monitors the performance of the DSP processor and detects when the DSP processor fails. Similarly, the DSP processor can be reprogrammed, reset, and be given new operating parameters, i.e. personality characteristics specific to each radio installation and customer, by the controller microprocessor.

Figure 4A:
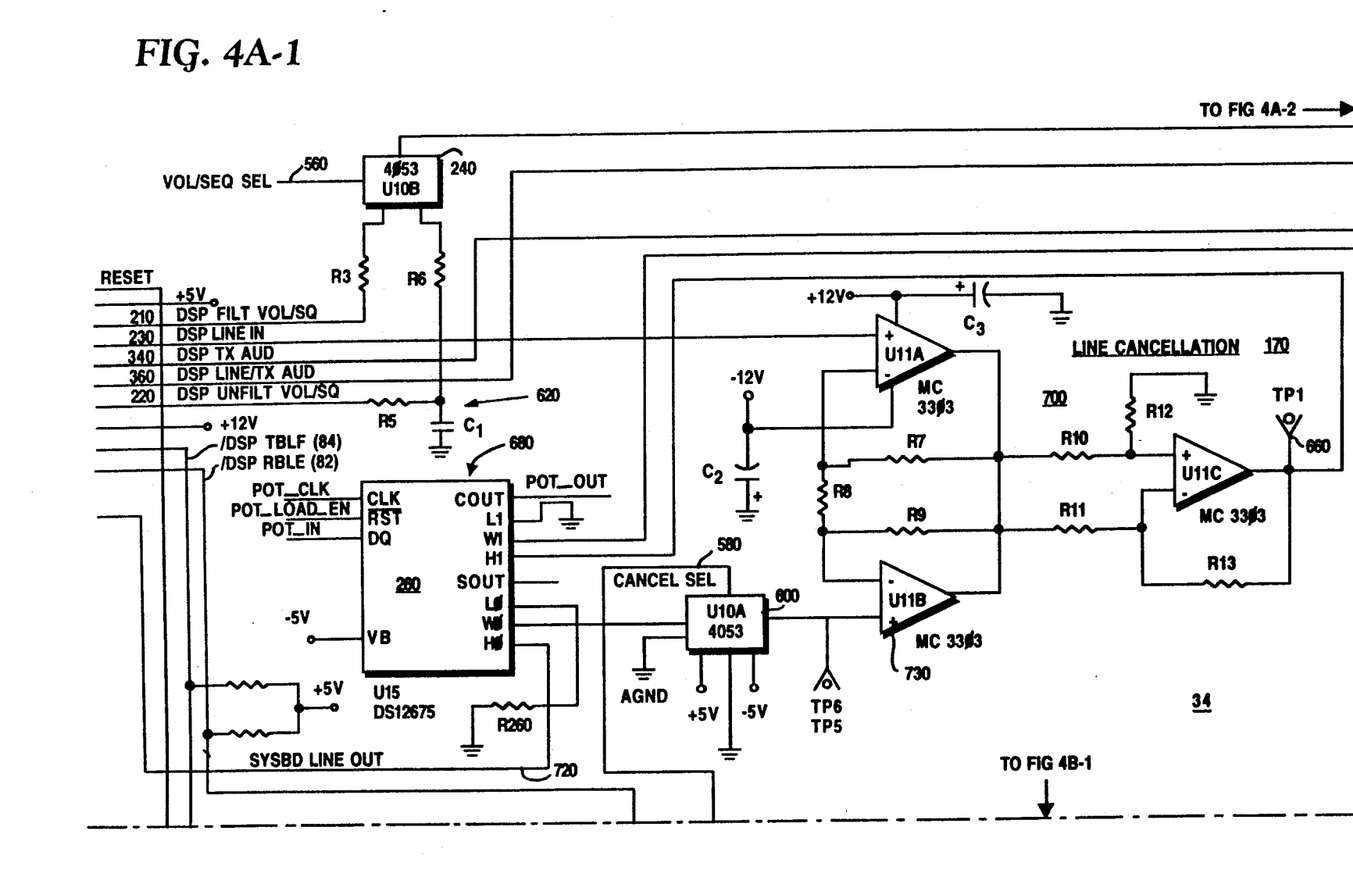
FIGS. 4A and 4B show a detailed schematic representation of the DSP board of the preferred embodiment.
Figure 4A:
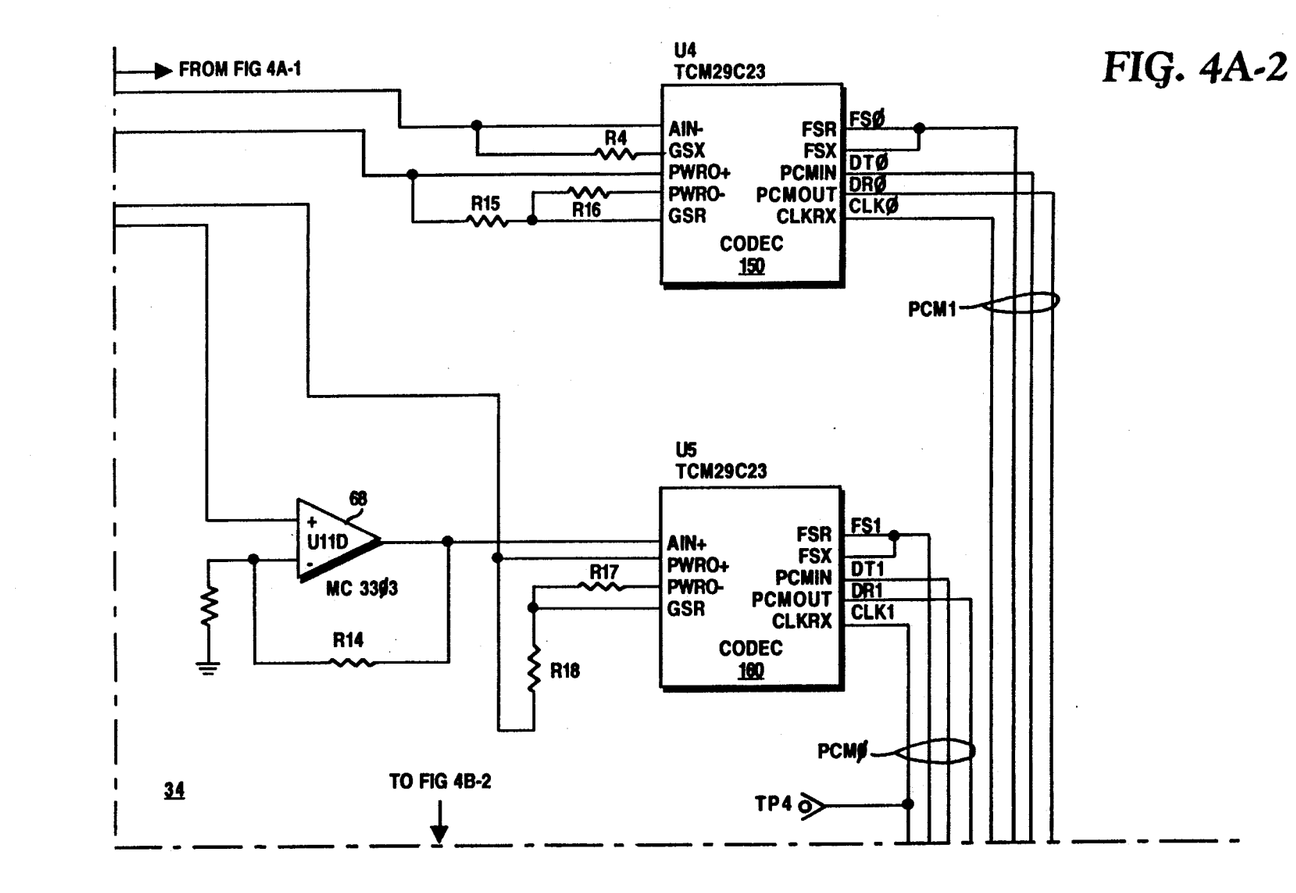
Figure 4B:
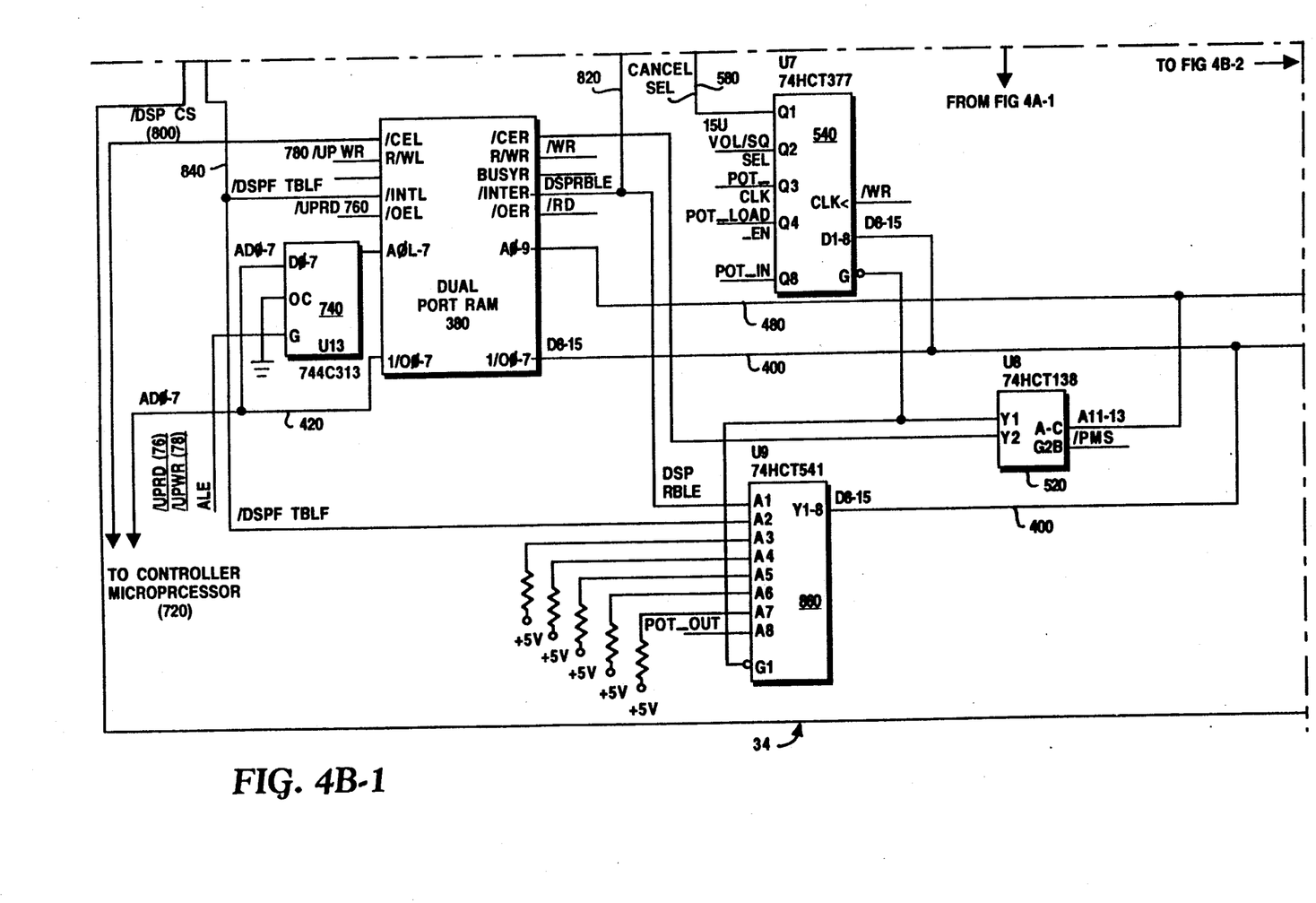
Figure 4B:
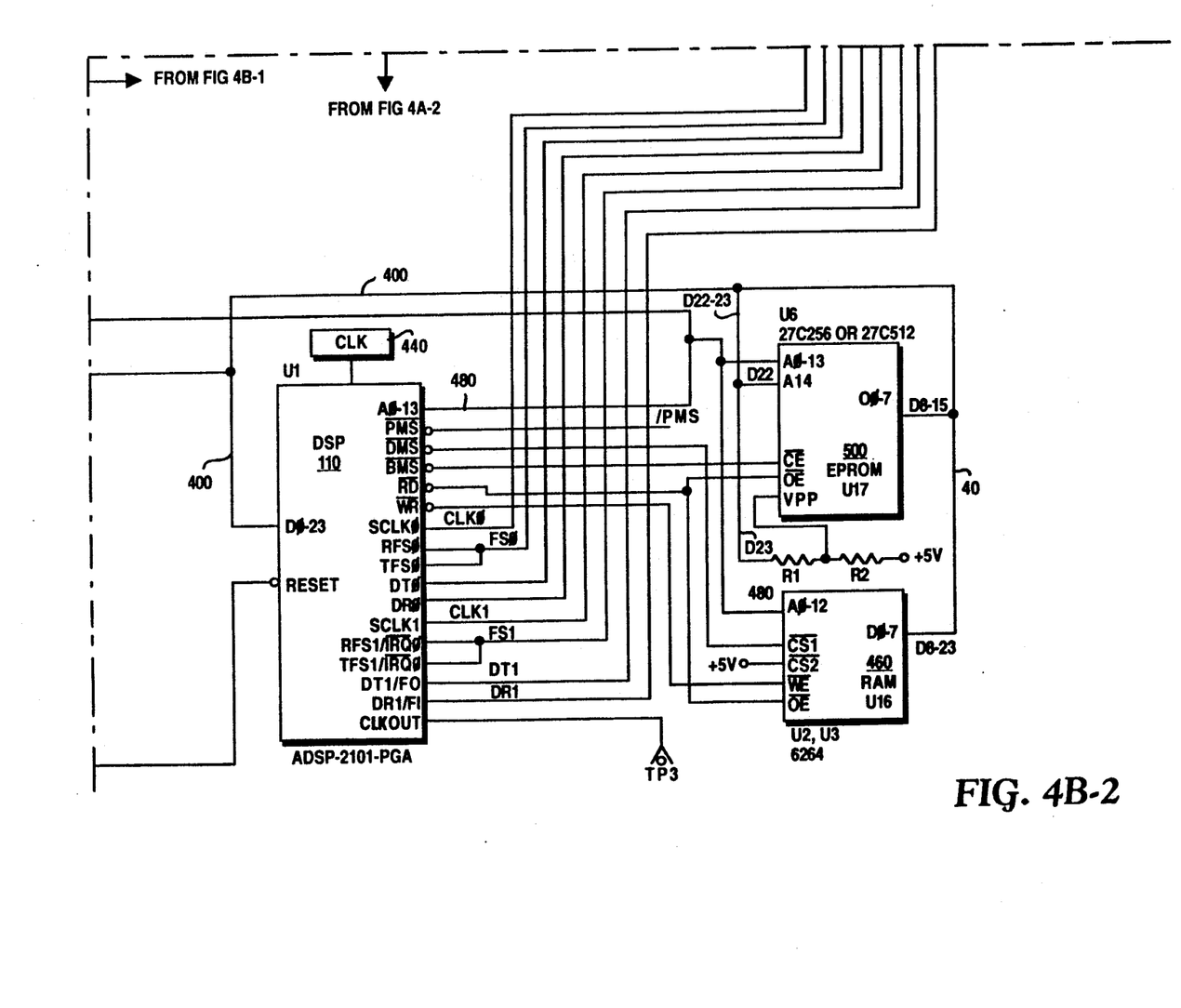

FIGS. 4A and 4B show a detailed schematic diagram of the DSP board 34, of the current embodiment. Audio and control inputs come from the control module board (not shown but fully disclosed in U.S. Ser. No. 07/620,422 entitled "Remote Control of RF Base Station Via Digital Communications."

As an overview, The audio inputs lines are DSP FILT VOL/SQ (210), DSP UNFILT VOL/SQ (220), and DSP LINE IN 230. These analog audio inputs are selected and conditioned by switch 240, the line cancellation circuit 170, and digital potentiometer 260. The audio signals are then sampled and digitized by the combo codecs 150 and 160. In the preferred embodiment these codecs are TCM29C23 models manufactured by Texas Instruments, Inc. The digital audio data is sent to the DSP processor 110 for digital signal processing. The DSP processor sends the processed audio data, e.g. digitized tones or audio after being passed through a notch filter, back to the codecs 150 and 160 that convert the digital audio to analog signals. The analog audio is output to the control module board on DSP TX AUD 340 and DSP LINE/TX AUD 360.

The information obtained by the DSP processor from analyzing the audio inputs is communicated digitally to the control module microprocessor through a dual port RAM 380. Messages are written by the DSP processor into the dual port RAM over a data bus 400. The controller microprocessor reads the messages from the dual port RAM through a connector bus 420 with the control board.

In the preferred embodiment, the dual port RAM contains a DSP byte MAP shown in Table 1.

TABLE 1

DSP BYTE MAPPING AND BIT ALLOCATIONS:

Overview: This protocol covers communications between the Control Shelf and the DSP Board on MASTRIIe/III stations. In particular, this document outlines a method by which the DSP configuration registers may be set most efficiently by the Control Shelf. This task is best accomplished by RESET-INITIALIZATION. Reset initialization is performed on all variables which are not meant to be changed in a real-time fashion during normal control shelf operation.

Also, a watchdog timer function has been added to the DSP board.

Reset-Initialization Locations, Variables, Defaults, and Definitions:

| Addr | Name | Default | Notes |
|---|---|---|---|
| 00 | TONE REMOTE ENABLE | (0 × 01) | 1 = enable, 0 = disable |
| 01 | TONE REMOTE INPUT0 ENABLE | (0 × 01) | 1 = enable, 0 = disable |
| 02 | TONE REMOTE INPUT1 ENABLE | (0 × 00) | 1 = enable, 0 = disable |
| 10 | DTMF ENABLE | (0 × 00) | 1 = enable, 0 = disable |
| 11 | DTMF INPUT0 ENABLE | (0 × 00) | 1 = enable, 0 = disable |
| 12 | DTMF INPUT1 ENABLE | (0 × 01) | 1 = enable, 0 = disable |
| 20 | TYPE 90 ENABLE | (0 × 00) | 1 = enable, 0 = disable |
| 21 | TYPE 90 INPUT0 ENABLE | (0 × 00) | 1 = enable, 0 = disable |
| 22 | TYPE 90 INPUT1 ENABLE | (0 × 01) | 1 = enable, 0 = disable |
| 30 | WIRE SELECT | (0 × 00) | 1 = 4 wire, 0 = 2 wire |
| 31 | VOLSQ SELECT | (0 × 01) | 1 = filtered, 0 = unfiltered |
| 40 | LINE POT VALUE | (0 × 20) | 00 = minimum gain, FF = maximum gain |
| 41 | CANCEL POT VALUE | (0 × 20) | 00 = minimum gain, FF = maximum gain |
| 50 | ANTI-FALSING FILTER ENABLE | (0 × 00) | 1 = enable, 0 = disable |
| 51 | ANTI-FALSING FILTER INPUT0 ENABLE | (0 × 00) | 1 = enable, 0 = disable |
| 52 | ANTI-FALSING FILTER INPUT1 ENABLE | (0 × 01) | 1 = enable, 0 = disable |
| 53 | ANTI-FALSING FILTER OUTPUT0 ENABLE | (0 × 00) | 1 = enable, 0 = disable |
| 54 | ANTI-FALSING FILTER OUTPUT1 ENABLE | (0 × 01) | 1 = enable, 0 = disable |
| 60 | HOLD TONE FILTER ENABLE | (0 × 01) | 1 = enable, 0 = disable |
| 61 | HOLD TONE FILTER INPUT0 ENABLE | (0 × 01) | 1 = enable, 0 = disable |
| 62 | HOLD TONE FILTER INPUT1 ENABLE | (0 × 00) | 1 = enable, 0 = disable |
| 63 | HOLD TONE FILTER OUTPUT0 ENABLE | (0 × 01) | 1 = enable, 0 = disable |
| 64 | HOLD TONE FILTER OUTPUT1 ENABLE | (0 × 01) | 1 = enable, 0 = disable |
| 70 | TONE ENABLE | (0 × 00) | 1 = enable, 0 = disable |
| 71 | TONE INTERRUPT0 ENABLE | (0 × 01) | 1 = enable, 0 = disable |
| 72 | TONE INTERRUPT1 ENABLE | (0 × 00) | 1 = enable, 0 = disable |
| 73 | TONE OUTPUT0 ENABLE | (0 × 00) | 1 = enable, 0 = disable |
| 74 | TONE OUTPUT1 ENABLE | (0 × 01) | 1 = enable, 0 = disable |
| 75 | TONE FREQUENCY1 | (0 × 1F) | |
| 76 | TONE FREQUENCY2 | (0 × 32) | |

TONE FREQUENCY = TONE * 4.096 (put into hexadecimal)
ex. TONE FREQUENCY = 1950 * 4.096 = 7987 = 1F32 (base 16)

| Addr | Name | Default | Notes |
|---|---|---|---|
| 80 | COMPRESSOR ENABLE | (0 × 00) | 1 = enable, 0 = disable |
| 81 | COMPRESSOR INPUT0 ENABLE | (0 × 01) | 1 = enable, 0 = disable |
| 82 | COMPRESSOR INPUT1 ENABLE | (0 × 00) | 1 = enable, 0 = disable |
| 83 | COMPRESSOR OUTPUT0 ENABLE | (0 × 01) | 1 = enable, 0 = disable |
| 84 | COMPRESSOR OUTPUT1 ENABLE | (0 × 01) | 1 = enable, 0 = disable |
| 85 | COMPRESSOR THRESHOLD1 | (0 × 7F) | |
| 86 | COMPRESSOR THRESHOLD2 | (0 × FF) | |
| 90 | ID_COMP1 | (0 × FE) | |
| 91 | ID_COMP2 | (0 × EF) | |
| 92 | ID_COMP3 | (0 × E6) | |
| 93 | ID_COMP4 | (0 × 6F) | |
| 94 | ID_COMP5 | (0 × ED) | |
| 95 | ID_COMP6 | (0 × FE) | |
| 96 | VERSION1 | (0 × 01) | VERSION 01.00 |
| 97 | VERSION2 | (0 × 00) | |
| 98 | DAY | (0 × 01) | 1ST |
| 99 | MONTH | (0 × 10) | OF OCTOBER |
| 9A | YEAR1 | (0 × 19) | 19 |
| 9B | YEAR2 | (0 × 90) | 90 |
| 9C | HOUR | (0 × 12) | TWELVE O'CLOCK |
| 9D | MINUTE | (0 × 00) | |
| 9E | CHECKSUM1 | (0 × 00) | CHECKSUM 0000 |
| 9F | CHECKSUM2 | (0 × 00) | |

FF-WRITE TO DSP FLAG SET-Writing to this byte sends a flag to the DSP telling it that there is a message. The value of the bits do not matter.
FE-READ FROM DSP FLAG CLEAR-Reading from this byte clears a flag which tells the DSP that its message was received.
F8-READ FROM DSP FUNCTION BYTE-This byte contains a function return value.
BITS 7 through 5 contain the function as defined above. BITS 4 through 0 contain a tone value as listed in the tone remote, type 90, or DTMF tone tables. The return value for these detection schemes occurs each time a new tone is detected. If the function is other than a detect scheme, these bits are set to the value enable = 1's, disable = 0's.

The DSP processor is the main logic device of the DSP board. This processor requires external hardware to function. A conventional clock 440 is needed for timing purposes. In a preferred embodiment, the clock sends a 8.192 MHz pulse generated by a crystal. The clock includes capacitors (not shown) to provide a load needed for reliable start-up of the DSP processor and stable oscillation.

The memory requirements of the DSP processor exceeds the internal memory capacity of the processor. Accordingly, in the preferred embodiment, two identical 8K×8-bit static RAMs 460 (shown as one memory block for purposes of illustration), provide an 8K×16-bit external data memory space for the DSP processor. The two RAMs together provide storage for 16-bit words that are compatible with the DSP processor that has a 1K×16-bit data architecture. One of the RAMs holds the most significant byte of a word D16-D23 and the other RAM holds the least significant byte D8-D15. The data bus D 0-23 (400) from the DSP also extends to the external memory. The RAMs can receive lines D8-23 of this bus on their pins D0-7.

The DSP processor automatically addresses the external RAMs when the processor addresses a data memory location exceeding the internal 1K of memory in the processor. An address bus A 0-13 (480) from the DSP transfers address locations between the DSP processor and the RAM pins A 0-12. The RAM data memory is enabled when the DSP processor places a low logic value on its DMS pin that is connected to $\overline{CS1}$ of the RAM. To read data from the RAM, the DSP processor places a low impedance on its RD pin that acts on the $\overline{OE}$ pin of the RAM. To write data into the RAM, the DSP sets a low impedance on the $\overline{WR}$ pin that acts on the $\overline{WE}$ pin of the RAM. The DSP processor completes its access of the external RAMs by returning the RD or WR pins to a high impedance and placing a logic high on the DMS pin.

In the preferred embodiment, the DSP processor has 2K of internal volatile memory. Accordingly, the data and addresses stored in internal memory are lost when power is turned off to the DSP processor. A 16K×8-bit EPROM 500 provides non-volatile memory storage for the DSP processor. The DSP personality information is written at power up to the DSP internal RAM by the digital control board processor. The program for operating the DSP processor and certain operating parameters, such as filter coefficients, needed by the DSP processor are stored in the EPROM. When the DSP processor is reset or booted when powered up, the up to 2K bytes of internal program is loaded into the DSP processor from the EPROM.

The amount of memory stored in the EPROM can be up to 8 pages of code. Seven of these pages can be loaded with various software codes for the DSP processor. The digital control board can write new program and other information into the EPROM. The control board receives the code from an external source, such as a remote terminal communicating over a telephone line.

Page zero is the initial "boot page" that controls the subsequent booting or rebooting of the other boot pages into the DSP processor. This boot page cannot be changed. The boot page is a sequence of read cycles that initialize the DSP processor. In the preferred embodiment, the end of the boot page calls up page 1 (next page) from the EPROM. Page 1 contains the software routines needed to respond to DSP processor interrupts. The DSP processor can force a reboot from any other page of EPROM 500.

When power is applied to the DSP processor, the BMS pin applies a low logic state to the $\overline{CE}$ on the EPROM to enable the EPROM. The addresses are sequenced on address bus A0-13 (480) and data bus D22-23 (400) of the DSP processor. Similarly, the RD pin on the processor activates data bus D8-15 for each transfer of program memory from the EPROM to the internal memory of the DSP processor. If larger EPROM memory is required, then that memory can be addressed through the D22 and 23 lines of bus 400 that are coupled to A14-15 of EPROM 500.

In the preferred embodiment, the EPROM can be set to operate with a 27C256 which allows four (4) or a 27C512 which allows eight (8) pages of memory using zero ohm resistors R1 and R2. If only four pages of capacity is required, a 27C256 EPROM is used and R2 is present on the board but not R1 so that the Vpp pin on this EPROM is a program pin permanently set at five volts. If eight pages of capacity are required, the EPROM can be a 27C512 and R1 is present but not R2 so that A15 (instead of Vpp) is connected to D23 of the DSP processor to act as an added address pin.

The DSP Board receives analog audio inputs from the receiver and the line simultaneously. The two receiver audio input settings are DSP FILT VOL/SQ (210) and DSP UNFILT VOL/SQ (220). The two line audio input settings are a 2-wire line input and a 4-wire line input. The DSP board selects the audio input but is subject to user programming to allow the user to select the audio source. The DSP processor actuates audio selection for the receiver inputs and the line inputs. The processor uses an address multiplexer 520 to select a D-flip-flop register 540. To select the flip-flop, the DSP processor sets address bus A11-13 (480) to a binary 100 when processor's PMS pin goes low. This address sequence causes Y1 on the multiplexer 520 to go low and enable data to pass through to the flip-flop 540.

Data passes through the multiplexer when WR from the DSP processor goes low and then high. Data bus 400 lines D8 and D9 enter the flip-flop and are outputted on Q1 and Q2 as VOL/SQ SEL (560) and CANCEL SEL (580). The VOL/SQ SEL signal operates digitally-controlled, analog switch 240 that selects either of the filtered or unfiltered audio inputs from the receiver. If VOL/SQ SEL is a logic high, then DSP UNFILT VOL/SQ (220) is selected. If VOL/SQ SEL is low, then DSP FILT VOL/SQ (210) is selected. Similarly, CANCEL SEL (580) operates digitally controlled, analog switch 600 that selects either 2-wire or 4-wire operation. If CANCEL SEL is a logic high, then 4-wire operation is selected. If it is low, then 2-wire operation is selected.

Each of the audio channel selections requires proper level adjustment to insure an optimal analog to digital conversion. The codecs 150, 160 perform the conversion and have a suitable range for input signals. Accordingly, the dynamic ranges of the analog signals must be conditioned to ensure that the codecs are neither underdriven nor saturated. Conditioning the signals assures that the digital audio signal has a uniform signal to noise ration (SNR).

The filtered receiver audio DSP FILT VOL/SQ (210), is received by the DSP board after the control module has de-emphasized the signal and filtered out the channel guard signal component. In the preferred embodiment, the filtered audio is received at the DSP board a maximum of 1.16 Vrms. This filtered audio needs only to be amplified to ensure that it is within the dynamic range of the codec 150. The amplification factor is dependent on resistors R3 and R4. In the preferred embodiment, the amplification factor is 1.25 so that the maximum input voltage to the codec is 1.45 Vrms.

Unfiltered receiver audio must be conditioned on the DSP board 34. The DSP board must de-emphasize the audio and level adjust it for the codec. An RC network 620 composed of resistor R5 and capacitor C1 de-emphasizes by attenuating high frequency signals. In the preferred embodiment, the RC network rolls off the signal at a rate of 20 dB/decade from 60 to 3 kHz frequency. This RC network induces 24.6 dB of attenuation at 1 kHz.

In the preferred embodiment, resistors R6 and R4 provide level equalization by amplifying the 0.176 Vrms following the de-emphasis RC network to a 1.46 Vrms maximum input voltage for the codec 150.

The system controller module switches between 2-wire and 4-wire line input (line/duplex line). This controller module only feeds the output (2W/4W) of its switch to the DSP board. Therefore, only one line input is needed to the DSP board. The controller module outputs the SYSBD LINE OUT signal to the DSP board so the line cancellation circuit 170 can subtract the signal the base station is sending out of the 2-wire line. Because of this subtraction, only the signal from the remote console remains on line. With respect to the 4-wire line audio input that enters the DSP board over the DPLX line input pair from the control module when in the 4-wire configuration. The 4-wire configuration has two dedicated audio input lines and two output lines. Thus, audio can be simultaneously fed into and out of the control module without the signals colliding on the lines. The audio line must be adjusted to level the signal and account for the up to 30 dB signal loss that can occur in the line between a remote control unit and the base station. In the preferred embodiment, the line equalizer must be able to attenuate a signal as great as 2.47 Vrms and amplify a 77.3 mVrms signal to the maximum input level of the codec of about 1.4 Vrms.

In the 4-wire configuration, DSP LINE IN (230) proceed through a standard line cancellation circuit 170 having a network of differential amplifiers U11A, U11B, U11C, and U11D, capacitors C2 and C3, and resistors R7 to R14. In the preferred embodiment, the DSP LINE IN 230 signal propagates through the line cancellation circuit to connection TP1 (660) with a gain of only 1.09. AGND on switch 600 causes the line cancellation circuit to stop cancelling or to subtract $\phi$ (AGND) from the signal present at LINE IN 230. Thus, it becomes a gain stage or buffer stage with gain of 1.09. There is a digitally controlled variable gain stage 680 comprising R14, digital potentiometer 260, and operational amplifier U11D. The amount of gain is determined by the resistance of the potentiometer. In the preferred embodiment, the DSP processor programs this resistance to a value between 0 to 10K ohms. This digitally programmed impedance coupled with the operational amplifier applies a selected amount of gain to the signal to bring the signal within the range of the codec.

In the preferred embodiment, the DSP processor (110) requires 34 clock cycles to load the digital potentiometers. The DSP processor controls the multiplexer 520 to select the D-flip-flop 540. To do this, the DSP processor applies a binary 100 to lines A11–A13 of address bus 480 when the PMS pin goes low. This binary address sequence causes the multiplexer to pass data to the flip-flop by setting its G2B pin low on the multiplexer. Data is written into the flip-flop on lines D 10, D11 and D15 of data bus 400. In turn, the flip-flop transfers the data from these lines out onto POT CLK, POT LOAD EN, and POT IN that feed directly to potentiometer 260.

POT CLK is the serial clock to count off the 34 steps, POT IN is the serial data input, and POT LOAD EN is the serial load enable. During a load cycle for the potentiometer, POT LOAD EN is held high while seventeen POT IN values are set up and held with each rising edge of the clock pulse train on POT CLK. In the preferred embodiment, the first of these seventeen POT IN values can be any value, and the remaining sixteen values comprise two 8-bit wiper positions that set the resistances of the potentiometer.

When receiving line audio from a two wire source, such as a remote dispatcher control unit, where input and output signals share the same wires, incoming and outgoing audio may occur simultaneously. The 2-wire line input feeds in from the Line Input. Since the outgoing signals would interfere with the incoming signals if occurred they simultaneously, line cancellation circuit 170 cancels the outgoing signal from the input. Accordingly, the line cancellation circuit cancels this interfering outgoing audio from the audio line. At the same time, the line cancellation circuit must amplify the audio signal that may be as low as 30 dB down.

To cancel the outgoing audio when in the 2-wire configuration, a differential instrumentation amplifier 700 that comprises differential amplifiers U11 (A, B and C), resistors R7 to R13, and the digital potentiometer 260 in conjunction with 260. The SYSBD LINE OUT 720 is the station's outgoing signal that is subtracted from the 2-wire input signal. This outgoing signal is not at the same level as on the line, so it must be level adjusted to the same level present on the line in order to cancel correctly. The SYSBD LINE OUT is level adjusted by the potentiometer, and proceeds to the differential amplifier 730 where it is subtracted from the line input signal. The signal remaining after this subtraction is line in audio that is subsequently level adjusted by the other half of potentiometer 260 in the same manner as was the 4-wire signal.

The analog outputs from the DSP board are on lines DSP TX AUD (340) and DSP LINE/TX AUD (360). These outputs proceed directly to the control module from the operational amplifier stages of codecs 150, 160. The gain applied to the DSP TX AUD output is determined by the values of resistors R17, 18 duplicate designators adjacent codec 160. Similarly, the gain applied to the DSP LINE/TX AUD output is determined by the values of resistors R15, R16 adjacent codec 150.

Full duplex, parallel communications occur between the DSP processor 110 and the microprocessor controller of the control module. The dual port RAM (380) provides the interface between the DSP processor and the microprocessor controller. Byte-wide messages pass over address/data bus 420 from the controller microprocessor to the dual port RAM. Similarly, messages pass between the dual-port RAM and the DSP processor over address bus 480 and data bus 400.

In the preferred embodiment, the controller microprocessor 720 is an eight-bit processor that reads and writes into the dual-port RAM 380. Latch 740 connected to bus 420, captures the address, on lines AD-7–AD0. The address to be placed in the latch is clocked in on a high ALE signal from the controller microprocessor when that microprocessor reads from or writes to the dual-port RAM. When the ALE signal returns to a logic zero, then pins AD7–AD0 on the latch become bidirectional data pins. To write into the dual-port RAM, the controller microprocessor puts data on the bus to be loaded into the dual-port RAM.

To read data from the dual port RAM, the controller microprocessor releases the data lines AD7-AD0 on the bus. Thereafter, either the uP RD (read) (760) or uP WR (write) (780) line goes low on the microprocessor 720 to send a pulse to execute the desired read or write function to or from the dual port RAM. In addition, these read and write functions occur only when the DSP CS (800) signal is held low. In this manner, the controller microprocessor controls the memory in the dual port RAM and, thus, the operation of the address-/data bus 420, so that the addresses and data are exclusively separated on the bus.

In the preferred embodiment, the DSP processor 110 reads from and writes to the dual port RAM 380 by first selecting the communication memory space in the RAM. The DSP processor sets lines A13-A11 to a binary 010 on the address bus to multiplexer 520 when the PMS pin of the processor goes low. This binary sequence sets low the Y2 pin on the multiplexer 520 to enable the dual port RAM. Once the DSP processor has enabled the dual port RAM, the communications memory of the RAM is accessed over address lines A9-A0 of address bus 480 and data lines D15-D8 of data bus 400. The DSP processor can then read from or write into the dual port RAM with low going pulses on pins RD or WR.

The coordination of messages between the DSP processor and the controller microprocessor 720 is accomplished through the DSP RBLE (820) and DSP TBLF (840) flags in the dual port RAM 380. In the preferred embodiment, the DSP processor sets the TBLF flag by writing into the the location 3FFH of the dual port RAM. This TBLF flag advises the controller microprocessor that a message is waiting in the dual port RAM. This flag is cleared when the microprocessor reads the flag from location 3FFH. Similarly, the microprocessor sets the DSP RBLE flag by writing to location 3FEH in the dual port RAM and the DSP processor clears the flag when it reads that location. In this manner, the DSP processor and controller microprocessor monitor flag conditions in the dual port RAM without simultaneously accessing the same memory locations.

To read these flags, the DSP processor, in the preferred embodiment, uses a tri-state buffer 860. This buffer precludes interfering contentions on lines D8-15 of the DSP data bus 400. The DSP processor reads or sets the flags by first selecting the buffer using multiplexer 520. When the DSP processor sets a binary 100 on lines A11-A13 of address bus 480 and allows its PMS pin to go low. This sequence causes pin Y1 of the multiplexer 520 to go low to enable data to pass into the buffer 860. The pins A1 and A2 of the buffer convey the DSP TBLF and DSP RBLE flags to lines D8 and D9, respectfully, of data bus 400. These flags are latched into the DSP processor when its RD pin returns high.

In operation, once the DSP processor has written a message into the dual port RAM it signals the controller microprocessor by setting DSP TBLF low. The controller microprocessor reads the message from the dual port RAM and then resets DSP TBLF to high to notify the DSP processor that another message may be loaded into the RAM. Similarly, the controller microprocessor loads a message into the dual port by first confirming that the DSP RBLE is high signifying that buffer 860 is empty and available for another message. When the microprocessor writes a message in the dual port RAM, then it sets DSP RBLE low to signal the DSP that a message is waiting. The DSP processor resets the DSP RBLE to high after reading the message.

The controller microprocessor monitors the operation of the DSP processor through a watch-dog timer function. The DSP processor is programmed to continually write a certain number, e.g., 55, into a predefined memory location, e.g., E0, in the dual port RAM. The controller microprocessor periodically confirms that this number is in the predefined memory location and then writes another number, e.g., 00, into the location. If the DSP processor does not write its number in the memory location within a certain period of time, the microprocessor resets the DSP processor causing the EPROM to reboot the microprocessor.

It is to be understood that the flexibility of the DSP board allows additional tone functions to be incorporated into the base station with no hardware changes to the DSP board. The hold tone filter function 100 is a standard notch filter that filters out the 2175 Hz hold tone from a voice audio signal. The purpose of the hold tone filter is merely to relieve the base station listener of the inconvenience of hearing the hold tone on top of a voice signal.

The implementation of a hold tone filter in the DSP processor was done using a commercially available program entitled "Hypersygnal Signal" sold by Hyperception of Dallas, Tex. Once the filter parameters are selected and inserted in the Hypersignal program, the program automatically creates an assembly language code capable of being used in the DSP processor. Routine experimentation and modification of this code is necessary to optimize code for the DSP processor.

In the preferred embodiment, the hold tone filter code was optimized with the objection of having minimum noise output from the filter when there is no input into the filter. To achieve this objective, a minimal number of cascaded stages was included in the filter and the pass band was made exceedingly flat and a gentle slope was applied to the cut off regions of the filter. The resulting filter achieved a greater than 45 dB attenuation of the signal at 2175 Hz with 0 dB attenuation of 1 kHz signals.

The tone detection function in the preferred embodiment is used for the DTMF and Type 90 tones that turn on and off the repeater function. In addition, tone remote detection is used to implement remote tone control of remote base stations. These tone detection routines are well known. Such detection routines are disclosed in chapter 6 entitled "Dual Tone Multi-Frequency Coding" of "Dual-Tone Multi-Frequency Receiver Using the WE (TM) DSP 16 Digital Signal Processor" published by AT&T.

Implementing DTMF tone detection and tone remote detection on the DSP processor is well known in view of information put out by the manufacturer of the DSP processor such as "Digital Signal Processing Applications With the TMS320 Family" and "Digital Signal Processing Applications With the TMS320 Family—Theory, Algorithms, and Implementations," Vol. 2, published by Texas Instruments, Inc.

The audio compression function is typically used when there are multiple remote units feeding into a single base station. These multiple units may desire to participate in a single communication. The degree of attenuation of each audio signal will be dependent, in part, on the distance from the base station of each remote unit. Thus, one remote unit may be near the base station, and thus, provide a loud, strong signal to the base station. A second remote unit may be distant from the base station and, thus, provide a weak, quiet signal to the base station. The base station must adjust the level, i.e., compress, both audio signals so that they can be transmitted at the same strength on the RF link. The audio compression function equalizes the audio signals received over various lines so that each of the audio line signals can be transmitted over an RF link. In short, compression is an automatic gain control function applied to an audio signal.

While the invention has been described in connection with what is presently considered to be the most practical and preferred embodiment, the invention is not limited to the disclosed embodiment. On the contrary, it covers various modifications and equivalent arrangements included within the spirit and scope of the appended claims.

What is claimed is:

1. A digitally-controlled radio communication device comprising:
   a. a controller processor for controlling radio functions;
   b. a digital signal processing module coupled to said controller processor and having audio input signals from both at least one RF receiver and at least one line, said module detecting tones in signals from receiver and line, communicating control information to said controller processor in response to said tones, and generating control tones for transmission; and
   a tone controlled squelch encoder generating squelch tones and controlled by said controller processor, said control tones and said squelch tones being combined and transmitted from an RF transmitter.

2. A digitally-controlled radio communication device as in claim 1, wherein said at least one line comprises a telephone line.

3. A digitally-controlled radio communication device according to claim 1, wherein said digital signal processing mode further comprises:
   a. a digital signal processor programmed to detect predetermined tones in signals and to write messages to a memory device also accessible by said controller processor;
   b. said memory device storing messages from either said controller processor or said digital signal processor, said controller processor reading from the memory device messages stored by the digital signal processor, and said digital signal processor reading messages stored by said controller processor.

4. A digitally-controlled radio communication device as in claim 3, wherein said digital signal processing module further comprises a digital potentiometer electrically coupled to said line and controlled by said digital signal processor, said digital signal processor adjusting the resistance level of said potentiometer.

5. In an RF base station of the type including an RF transmitter, an RF receiver, and a digital controller operatively connected to control said RF transmitter and RF receiver, a digital signal processing module operatively coupled to receive RF tones from said receiver, send tones for transmission by said transmitter and communicate with said controller, said digital signal processing module also coupled to audio signal lines, said digital signal processing module comprising:
   a digital signal processor programmed to detect tones superimposed on audio signals received from said RF receiver and signal lines, and to synthesize tones to be superimposed on audio signals transmitted by said RF transmitter and sent from said lines;
   conversion means for converting analog signals from said RF receiver and lines to digital signals sent to said digital signal processor, and for converting digital signals from said digital signal processor to analog signals sent to said RF receiver and lines, said conversion means operatively coupled to said digital signal processor;
   a memory device operatively coupled to said digital signal processor and said controller, said digital signal processor writing messages indicative of said detected tones in said memory device and said controller reading the messages written by said processor, and said controller writing control messages in said memory device and said processor reading the control messages, said digital signal processor acting in response to said messages, and
   a line cancellation circuit for accepting audio signals from 2-wire and 4-wire lines, said cancellation circuit having a programmable electronic potentiometer for attenuating signals received over said lines and for leveling signals in the 2-wire mode.

6. A method for repeating RF audio signals using an RF repeating base station including an RF transmitter, an RF receiver, a digital controller operatively connected to the transmitter and receiver, and a digital signal processor operatively coupled to said controller, transmitter and receiver, said method comprising the steps of:
   a. receiving via the receiver an RF audio signal having superimposed remote tones;
   b. detecting the remote tones in said digital signal processor and in response sending hold channel control messages to the controller;
   c. said controller causing the transmitter and receiver to continue operating on the channel(s) corresponding to the RF audio signal;
   d. notch filtering out the remote tones from the audio signal using the digital signal processor, and
   e. retransmitting the audio signal without the received remote tones from the repeater.

* * * * *